(12) United States Patent
Undy et al.

(10) Patent No.: US 6,493,792 B1
(45) Date of Patent: Dec. 10, 2002

(54) MECHANISM FOR BROADSIDE READS OF CAM STRUCTURES

(75) Inventors: Stephen R. Undy, Ft. Collins, CO (US); Terry L Lyon, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/495,155

(22) Filed: Jan. 31, 2000

(51) Int. Cl.[7] .......................... G11C 15/00; G06F 12/00
(52) U.S. Cl. ........................ 711/108; 711/128; 365/49
(58) Field of Search ................................ 365/49; 711/3, 711/128, 206, 207, 217, 219, 108

(56) References Cited

U.S. PATENT DOCUMENTS 5,428,565 A * 6/1995 Shaw ........................... 365/49
5,860,085 A * 1/1999 Stormon et al. ............. 711/108
6,000,008 A * 12/1999 Simcoe ........................ 711/108
6,101,573 A * 8/2000 Middleton et al. .......... 711/108
6,195,738 B1 * 2/2001 Akerib ......................... 712/12
6,215,685 B1 * 4/2001 Fung et al. .................... 365/49

* cited by examiner

Primary Examiner—Gary J. Portka
(74) Attorney, Agent, or Firm—Richard F. Schuette

(57) ABSTRACT

A CAM providing for the identification of a plurality of multiple bit tag values stored in the CAM, having logic circuitry for comparing each bit of an inputted test value to the corresponding bits of all stored tag values. A bit select is employed for generating a plurality of test bits for sequential input into the logic circuitry. The logic circuitry compares the plurality of test bits to the corresponding bit of each stored tag value and generates a "hit" signal if the selected bit is the same as the corresponding bit of the stored tag value. Storage means are employed for recording the results of the compare with the M hit signal.

9 Claims, 3 Drawing Sheets

MECHANISM FOR BROADSIDE READS OF CAM STRUCTURES

TECHNICAL FIELD

The technical field encompasses computer architectures having content addressable cache designs. In particular, an architecture that supports reading of the contents of the tag portion of a CAM structure without the need for a separate RAM read port.

BACKGROUND

Computer systems may employ a multi-level hierarchy of memory, with relatively fast, expensive but limited-capacity memory at the highest level of the hierarchy and proceeding to relatively slower, lower cost but higher-capacity memory at the lowest level of the hierarchy. The hierarchy may include a small fast memory called a cache, either physically integrated within a processor or mounted physically close to the processor for speed. The computer system may employ separate instruction caches and data caches. In addition, the computer system may use multiple levels of caches. The use of a cache is transparent to a computer program at the instruction level and can thus be added to a computer architecture without changing the instruction set or requiring modification to existing programs.

A cache hit occurs when a processor requests an item from a cache and the item is present in the cache. A cache miss occurs when a processor requests an item from a cache and the item is not present in the cache. In the event of a cache miss, the processor retrieves the requested item from a lower level of the memory hierarchy. Associated with cache design is a concept of virtual storage. Virtual storage systems permit a computer programmer to think of memory as one uniform single-level storage unit but actually provide a dynamic address-translation unit that automatically moves program blocks on pages between auxiliary storage and the high speed storage (cache) on demand.

Also associated with cache design is the concept of fully associative or content-addressable memory (CAM). Content-addressable memory is a random access memory that in addition to having a conventional wired-in addressing mechanism also has wired-in logic that makes possible a comparison of desired bit locations for a specified match for all entries simultaneously during one memory-cycle time. The specific address of a desired entry need not be known since a portion of its contents can be used to access the entry. All entries that match the specified bit locations are flagged and can be addressed the current or on subsequent memory cycles.

Memory may be organized into words (for example 32 bits or 64 bits per word). The minimum amount of memory that can be transferred between a cache and the next lower level of memory hierarchy is called a line or a block. A line may be multiple words (for example, 16 words per line). Memory may also be divided into pages or segments with many lines per page. In some computer systems page size may be variable.

In modem computer memory architectures, a central processing unit (CPU) produces virtual addresses that are translated by a combination of hardware and software to physical addresses. The physical addresses are used to access physical main memory. A group of virtual addresses may be dynamically assigned to each page. Virtual memory requires a data structure, sometimes called a page table, that translates the virtual address to the physical address. To reduce address translation time, computers may use a specialized associative cache dedicated to address location, called a translation lookaside buffer (TLB).

A cache may include many segments, or ways. If a cache stores an entire line address along with the data and any line can be placed anywhere in the cache, the cache is said to be fully associative. For a large cache in which any line can be placed anywhere, the hardware required to rapidly determine if and where an item is in the cache may be very large and expensive. For larger caches a faster, space saving alternative is to use a subset of an address (called an index) to designate a line position within the cache, and then store the remaining set of the more significant bits of each physical address, called a tag, along with the data. In a cache with indexing, an item with a particular address can be placed only within a set of lines designated by the index. If the cache is arranged so that the index for a given address maps exactly to one line in the subset, the cache is said to be direct mapped. If the index maps to more than one line in the subset, or way, the cache is said to be set-associative. All or part of an address may be hashed to provide a set index that partitions the address space into sets.

With direct mapping, when a line is requested, only one line in the cache has matching index bits. Therefore, the data can be retrieved immediately and driven onto a data bus before the computer system determines whether the rest of the address matches. The data may or may not be valid, but in the usual case where the data is valid, the data bits are available on the data bus before the computer system determines validity. With set associative caches, the computer system cannot know which line corresponds to an address until the full address is compared. That is, in set-associative caches, the result of tag comparison is used to select which line of data bits within a set of lines is presented to the processor.

Additional details related to prevalidated cache architectures are provided in U.S. patent application Ser. No. 08/955,821, filed on Oct. 22, 1997, now U.S. Pat. No. 6,014,732, entitled CACHE MEMORY WITH REDUCED ACCESS TIME, the disclosure of which is hereby incorporated by reference.

A fully associative cache is commonly defined as content-addressable memory (CAM) and is typically employed in computer systems having virtual memory. FIG. 1 illustrates the basic operation of a CAM 100. A tag value 101 is input into CAM and the associated data value 102 is outputted. While the preferred embodiment of the invention discloses a memory array associated with the CAM that temporarily stores instruction data that is fetched during the operation of the computer system, CAM's are commonly used for storing many types of data that must be accessed very quickly.

For manufacturing and verification reasons it is often desirable to be able to obtain a listing of all tag values stored in the CAM. There is typically no provision for identifying tag values as such identification is not required in the normal usage of a CAM. Where identification is required, a RAM port is usually added to the memory array. This allows the tag value of each entry of the array to be individually addressed and dumped out for review. The cost of adding this second port is primarily area on the IC and results in an adverse impact on the speed of the array.

It would be desirable and of considerable advantage to provide a method and apparatus for obtaining the tag values of a CAM that does not require the addition of a RAM port to the memory array.

SUMMARY

The present invention provides a method and apparatus for reading the tag portion of a CAM array without adding a second port to the CAM structure. Without a second port, the CAM structure takes less space on the IC and results in faster operation of the IC.

A CAM in accordance with the present invention provides for the identification of a plurality of multiple bit tag values stored in the CAM. Logic circuitry compares each bit of a test value to the corresponding bits of all stored tag values. A bit select is employed for generating a plurality of test bits for sequential input into the logic circuitry. The logic circuitry compares the plurality of test bits to the corresponding bit of each stored tag value and generates a "hit" signal if the selected bit is the same as the corresponding bit of the stored tag value. Storage means are employed for recording the results of the compare with the M hit signals.

In a CAM containing M entries, each entry having an N bit wide tag value, the invention reads N×M bits of data by generating M hit/miss signals that convey the result of the logic circuitry. The leftmost bit of the tag values for all M entries may be read simultaneously by performing a CAM operation that compares just 1 bit (out of N), the leftmost bit, of the tag values. The M compare results (from the M hit signals) are recorded in the storage means. By repeating this process for all N bits of the tag, all N×M bits of tag data may be generated and recorded. This data constitutes the entire contents of the tag portion of the CAM array.

DESCRIPTION OF THE DRAWINGS

The invention will be described with reference to the following drawings in wherein like numerals refer to like items, and wherein.

DETAILED DESCRIPTION OF THE INVENTION

Figure 1:
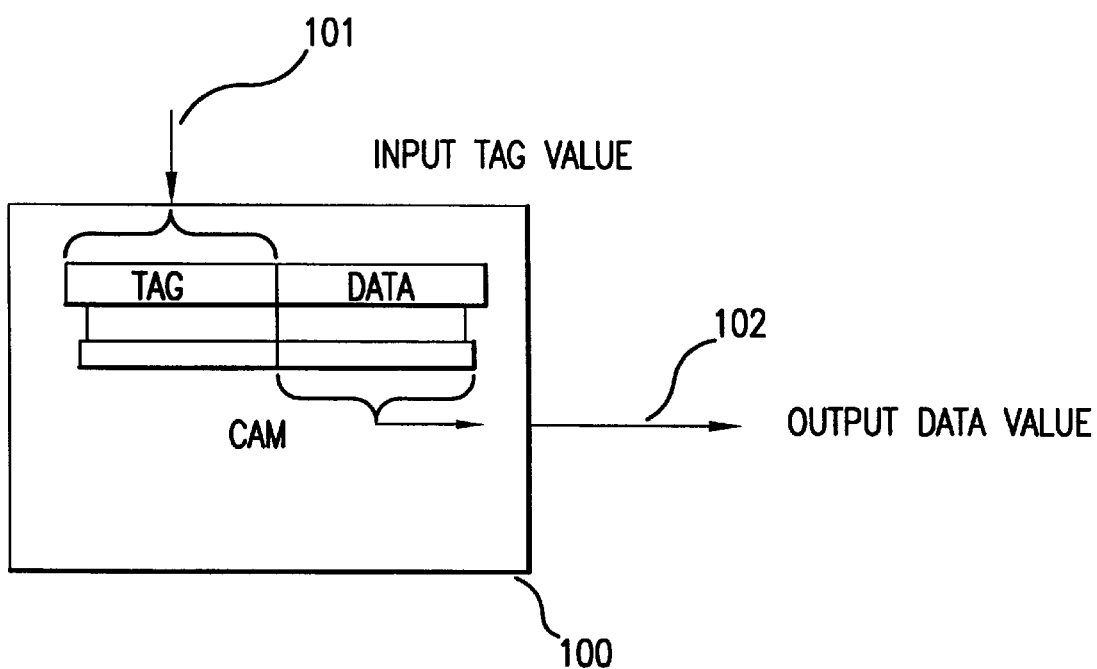
FIG. 1 is a simplified representation of a prior art CAM.
Figure 2:
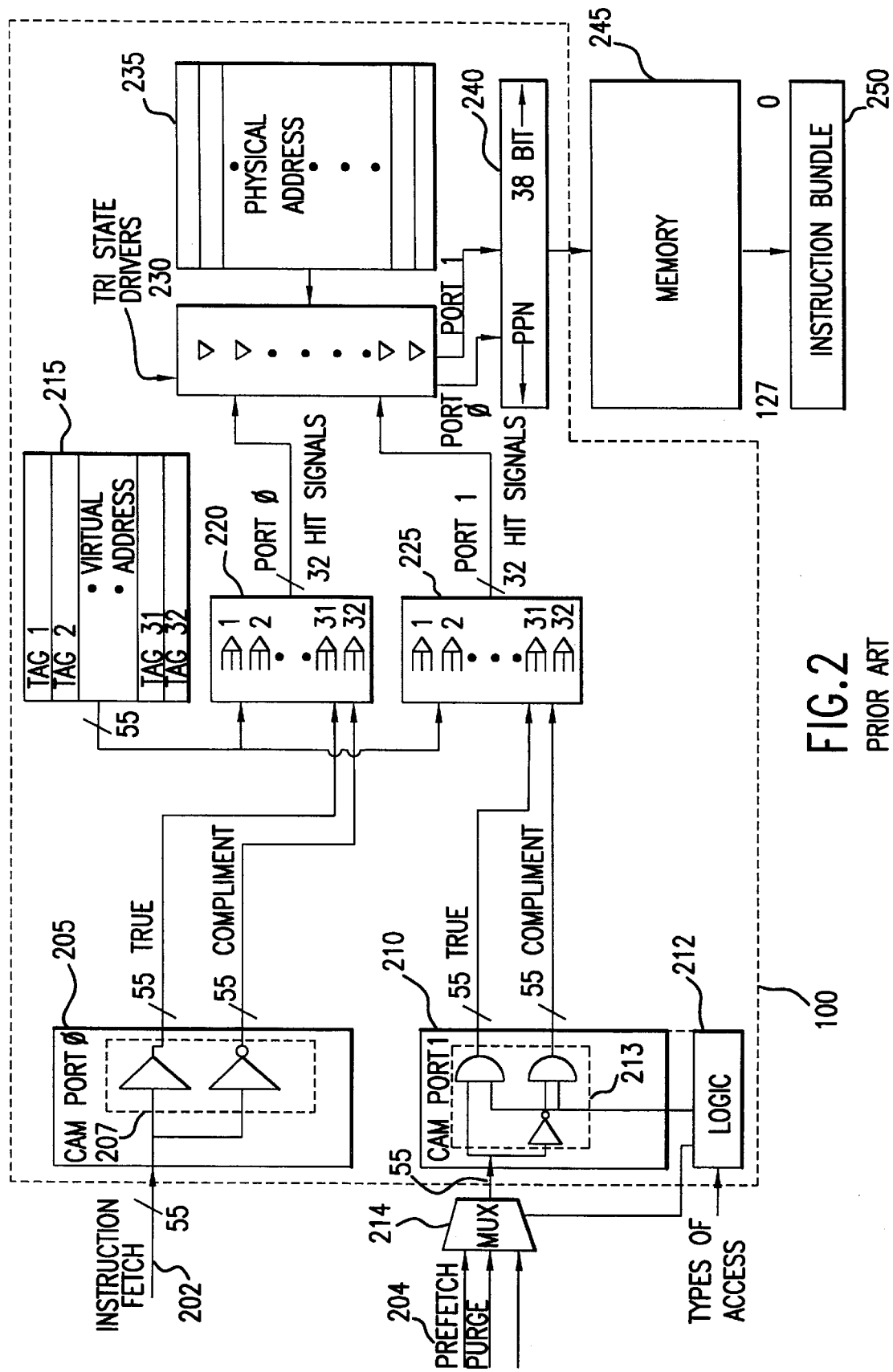
FIG. 2 depicts a simplified schematic of a prior art CAM.

With reference now to the drawings wherein like reference numerals designate corresponding parts throughout the several views, a schematic circuit diagram of a prior art CAM is shown in FIG. 2.

In particular, FIG. 2 illustrates the general operation of a CAM 100, having a CAM port "0" 205, CAM port "1" 210, control logic 212, Virtual Address array 215 for storing tag values, a bank of comparators 220 for comparing the output of Port 0 and the Virtual Address array 215, a bank of comparators 225 for comparing the output of Port 1 and the Virtual Address array 215, Physical Address array 235 for storing tag storage locations 240. The CAM is coupled to an associated data memory 245 for storing instructions 250.

In the preferred embodiment, the CAM 100 is employed in a computer system, accommodating at any one time, up to 32 different 52 bit tag values associated with, in this representative example, 32 instruction bundles. Such tag values and associated instruction bundles are generated by an instruction pointer (not shown) of the operating system when translating instructions having virtual addresses into physical addresses. A 52 bit tag value provides for $2^{52}$ possible different values.

An instruction fetch in the form of an N bit wide tag value 202 (in the preferred embodimen,t N=55), is input into the CAM driver 205. Independently, or simultanously, a prefetch, a purge or a snoop instruction, as determined by control logic 212 and accessed by the multiplxer 214, is input into the CAM driver 210. This input is in the form of an N bit wide tag value 204. The CAM ports 205/210 each include N True/Compliment driver pairs 207/213 that generate both the "true" and the "compliment" value for each bit of the inputted tag value. Each tag storage location within the Virtual Address array 215 is coupled to one of M comparators 220 and 225. A "hit" signal is generated by one of the comparators when there is a match between its corresponding tag value and the N outputs of the true/compliment drivers. Prior art CAM's provide for "ganging together" one or more of the True/Compliment driver pairs 213 such that under the control of logic 212, they can be "group enabled" for "housekeeping" purposes. For example, it may be necessary to match a 3 bit field within a virtual address.

The outputs of each of the M comparators 220 and 225 are coupled to one of M tri-state drivers 230 which are associated with its one of M corresponding physical address locations within the Physical Address space 235. Upon receipt of a hit signal, the corresponding physical address location (PPN) 240 of the desired instruction is outputted. Associated with the CAM 100, is a data storage device 245. Upon input of the physical address location 240, the corresponding instruction bundle is outputted.

Figure 3:
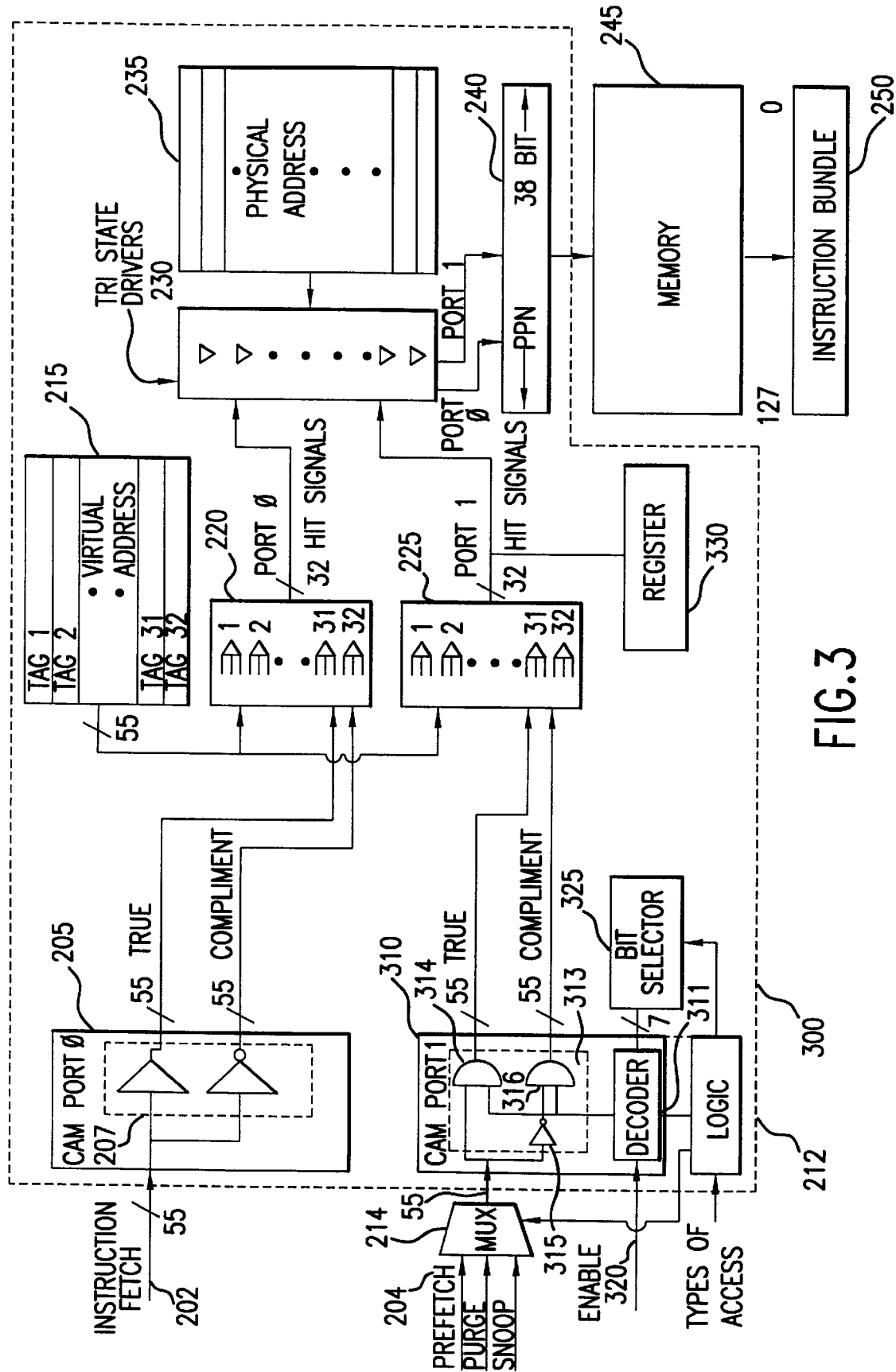
FIG. 3 depicts a simplified schematic of a CAM in accordance with a preferred embodiment of the invention.

FIG. 3 illustrates a CAM 300 in accordance with the preferred embodiment of the invention. Like the prior art CAM 100, the CAM 300 includes a CAM port "0" 205, control logic 212, a Virtual Address array 215, a bank of comparators 220 and a bank of comparators 225, Tri-State Drivers 230, Physical Address space 235 and a data storage device 245.

Unlike the prior art CAM 100, the CAM 300 employs a CAM port "1" 310 having a decoder 311 for generating N different bit positions corresponding to the N bits of each virtual address in the Virtual Address array 215. A bit selector 325 is employed for generating a series of binary numbers for input into the decoder 311. The bit selector 325 and an enable signal 320 are coupled to the decoder 311. When enabled, the decoder 311 outputs an N wide word (55 bits in preferred embodiment) having one bit high as selected by the bit selector (alternatively, only one bit could be set low).

A plurality of N True/Compliment drivers 313, each including an AND gate 314, and an inverter 315 coupled to one input of the AND gate 316, combine the output of the decoder 311 with the true and compliment of the inputted test value 204 (this could also be a purge etc. as controlled by the control logic 212). While the preferred embodiment employs a series of true/compliment drivers sets, one for each bit of the input tag value, one set for each stored tag value, one skilled in the art could substitute functionally equivalent logic circuitry. Functionally, true/compliment drivers include a two line input (one for the "true" value, and one for it's "compliment"). Each line is compared, and if they are identical, a "hit" will issue. With the exception of the bit being identified, all bits of the compliment line are pulled low.

The decoder 311, bit selector 325 and the enable signal 320 provide for modification of the compliment signal to include one high bit for any selected bit. The output of the true/complement drivers 313 are coupled to a plurality of comparators 225. Each of the tag storage locations in the Virtual Address array 215 is also coupled to the input of the comparators 225. Alternative embodiments in which multiple ports are used for testing, could also couple the outputs of the Virtual Address array 215 to comparators 220. Each of the plurality of comparators 225 generates a high or low signal corresponding to the selected bit within the tag value, as only one bit of each tag value is generated when there is a match between any of the N bit tag values and the N outputs of the true/compliment drivers 313.

Associated with the CAM 300, is a data storage register 330 which records the value of the selected bit (i.e., the "hit" signals, for all M tag values). Diagnose reads of the Virtual Address array 215 are performed indirectly, by employing the bit selector 325 and decoder 310 to sequentially CAM against a single bit in each of the 32 entries of the arrary. Each CAM against a single bit results in 32 hit/miss signals that are recorded in the register 330. By repeating the operation N times (In the preferred embodiment, N=55, corresponding to the length of the tag value), all N×M bits of data, constituting the entire contents of the tag portion of the CAM array are read out and recorded.

The terms and descriptions used herein are set forth by way of illustration only and are not meant as limitations. While the preferred embodiment of the invention is embodied in an instruction cache having a single port (port 1) for testing, the invention may be easily be embodied in multiple ports for multiple port testing, as well as in a data cache environment. Those skilled in the art will recognize that many variations are possible within the spirit and scope of the invention as defined in the following claims, and their equivalents, in which all terms are to be understood in their broadest possible sense unless otherwise indicated.

What is claimed:

1. A method for reading out tag values for each CAM entry stored in a CAM, comprising the method steps of:

storing an N bit wide tag value for each of M CAM entries in the CAM;

selecting one of N bits;

generating an N bit wide word having the selected bit high;

comparing the N bit wide word with all of the M entries simultaneously by performing a CAM operation;

generating a hit/miss signal corresponding to the result of each compare, wherein, the M hit/miss signals indicate the value of the selected bit for each M entries;

storing the M hit/miss signals; wherein, a hit indicates that the stored tag bit is a binary one, and a miss indicates a binary zero;

the step of comparing the N bit wide word with all of the M entries simultaneously by performing a CAM operation, further comprising the method step of:

repeating the compare step N times for all N bits of the tag, wherein M bits of data are recorded for each compare step, and the entire contents of the tag portion of the CAM array is accumulated.

2. A CAM having a test read operation for reading out the entire contents of the tag portion of the CAM array, comprising:

a memory for storing a plurality of tag values;

an inputted binary test value, a bit selector for generating a binary number corresponding to a selected bit;

a decoder for generating an N bit wide word having only the selected bit high, a plurality of true/compliment drivers coupled to the decoder and the inputted binary test value, for generating a true output corresponding to the binary test value in one or more bit positions with the remainder having a value of binary 0, and a compliment output corresponding to the logical compliment of the binary test value in one or more bit positions with the remainder having a value of binary 0, a plurality of comparators, coupled to the true/compliment drivers, for generating a hit signal when she selected bit is the same value as the corresponding bit of the stored tag value in the CAM, wherein a single bit of the tag value for all M entries may be read simultaneously by performing a CAM operation that compares just 1 bit (out of N) of the tag value.

3. The CAM having a test read operation for reading out the entire contents of the tag portion of the CAM array, as claimed in claim 2, further comprising output means for generating a hit/miss signal corresponding to the result of the compare, wherein, if the input value to be compared against is a binary one, then the value of the M hit signals will indicate the value of the one tag bit in each entry being compared against.

4. The CAM having a test read operation for reading out the entire contents of the tag portion of the CAM array, as claimed in claim 2, further comprising storage means for storing the M compare results from the M hit signals; wherein, a hit indicates that the stored tag bit is a one, a zero otherwise.

5. The CAM having a test read operation for reading out the entire contents of the tag portion of the CAM array, as claimed in claim 2, the bit selector further comprising means for arbitarily setting the selected bit high.

6. The CAM having a test read operation for reading out the entire contents of the tag portion of the CAM array, as claimed in claim 2, wherein, a 1 indicates a hit and a 0 indicating a miss.

7. A CAM providing identification of a plurality of multiple bit tag values stored in the CAM, comprising:

an inputted test value;

a decoder for generating a binary word having a selected bit high;

a plurality of true/compliment drivers for generating a true value of the inputted test value ANDed with the binary word and a compliment value of the inputted test value inverted, ANDed with the binary word;

logic circuitry for comparing each bit of the true value and the compliment value to the corresponding bits of all stored tag values, wherein, the logic circuitry compares each bit of the true value and the compliment value to the bit of each stored tag value corresponding to the selected bit and generates a binary high signal if the selected bit is the same as the corresponding bit of the stored tag value, and storage means for recording the results of the compare with M hit signals.

8. The CAM providing identification of a plurality of multiple bit tag values stored in the CAM, as claimed in claim 7, said decoder further comprising means to select 1 of N bits and to repeat the process N times for all N bits of the tag.

9. The CAM providing identification of a plurality of multiple bit tag values stored in the CAM, as claimed in claim 8, said storage means recording M bits of data for each compare operation and accumulating N×M bits of data by the end of the compare operation.

* * * * *